United States Patent [19]

Okano et al.

[11] Patent Number: 5,790,414
[45] Date of Patent: Aug. 4, 1998

[54] AUTOMATIC ROUTING METHOD AND AUTOMATIC ROUTING APPARATUS

[75] Inventors: Mitsunobu Okano; Hiroshi Miura; Toshiyasu Sakata; Hiroyuki Orihara, all of Kawasaki, Japan

[73] Assignee: Fujitsu Limited, Kawasaki, Japan

[21] Appl. No.: 966,659

[22] Filed: Nov. 10, 1997

Related U.S. Application Data

[63] Continuation of Ser. No. 521,424, Aug. 30, 1995, abandoned.

[30] Foreign Application Priority Data

Feb. 28, 1995 [JP] Japan ................... 7-040087

[51] Int. Cl.$^6$ .......................................... G06F 17/50
[52] U.S. Cl. ............................... 364/488; 364/489
[58] Field of Search ........................ 364/488, 489, 364/490, 491

[56] References Cited

U.S. PATENT DOCUMENTS

| | | | |
|---|---|---|---|
| 4,768,154 | 8/1988 | Sliwkowski et al. | 364/488 |
| 4,823,276 | 4/1989 | Hiwatashi | 364/491 |
| 4,910,680 | 3/1990 | Hiwatashi | 364/491 |
| 5,119,317 | 6/1992 | Narikawa et al. | 364/512 |
| 5,245,550 | 9/1993 | Miki et al. | 364/490 |
| 5,375,069 | 12/1994 | Satoh et al. | 364/490 |
| 5,550,714 | 8/1996 | Nishiyama | 364/490 |
| 5,583,788 | 12/1996 | Kuribayashi | 364/490 |

FOREIGN PATENT DOCUMENTS

| | | |
|---|---|---|
| 63-217643 | 9/1988 | Japan. |
| 5-102308 | 4/1993 | Japan. |
| 6-45441 | 2/1994 | Japan. |

*Primary Examiner*—Emmanuel Todd Voeltz
*Assistant Examiner*—Leigh Marie Garbowski
*Attorney, Agent, or Firm*—Armstrong, Westerman, Hattori, McLeland, & Naughton

[57] ABSTRACT

An automatic routing method and an automatic routing apparatus enable an optimum automatic routing under severe design conditions due to high-density mounting of an object of a wiring design such as an LSI, a multichip module, a printed wiring board, etc. The automatic routing apparatus has an area input unit for inputting area information for setting a routing controlled area in which an automatic routing is performed under specific routing control conditions within a wiring area of an object of the wiring design, a condition input unit for inputting condition information for designating the routing control conditions in the routing controlled area set according to the area information inputted from the area input unit, and an automatic routing unit for automatically routing under the specific routing control conditions designated according to the condition information inputted from the condition input unit within the routing controlled area.

10 Claims, 15 Drawing Sheets

F I G. 5
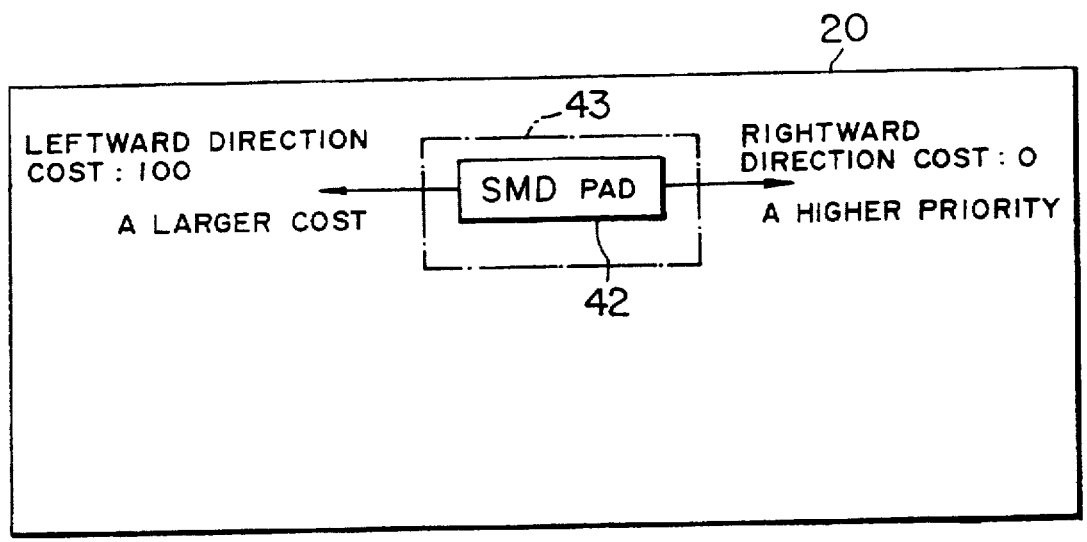

ROUTING PRACTICABLENESS DIRECTED AREA
( A HIGHER PRIORITY )

F I G. 9
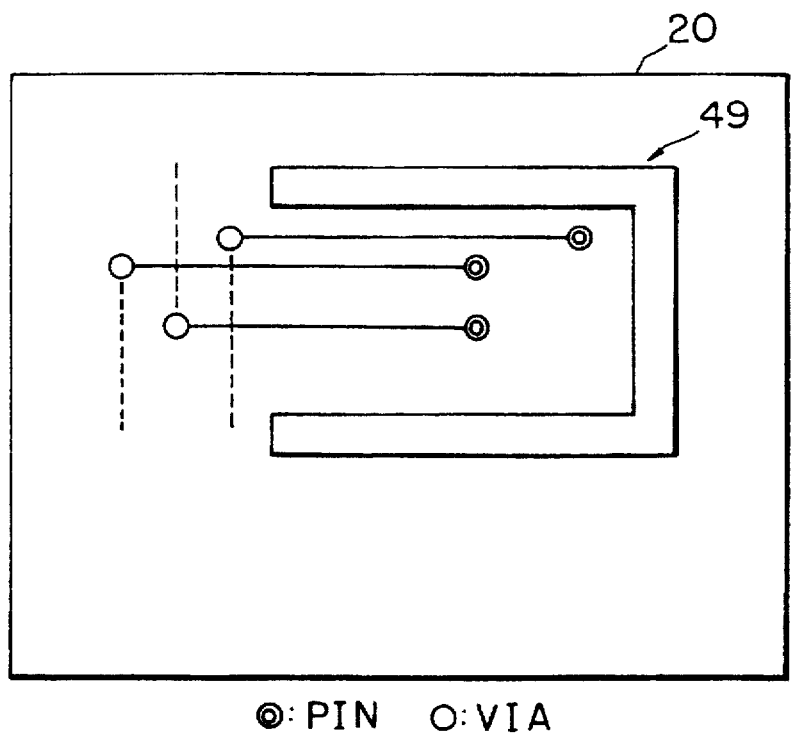
◉: PIN   ○: VIA

F I G. 13
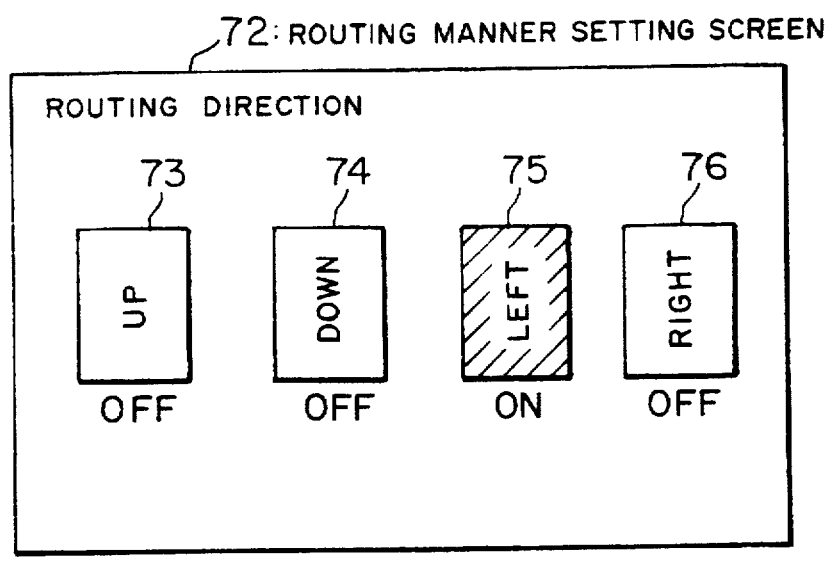

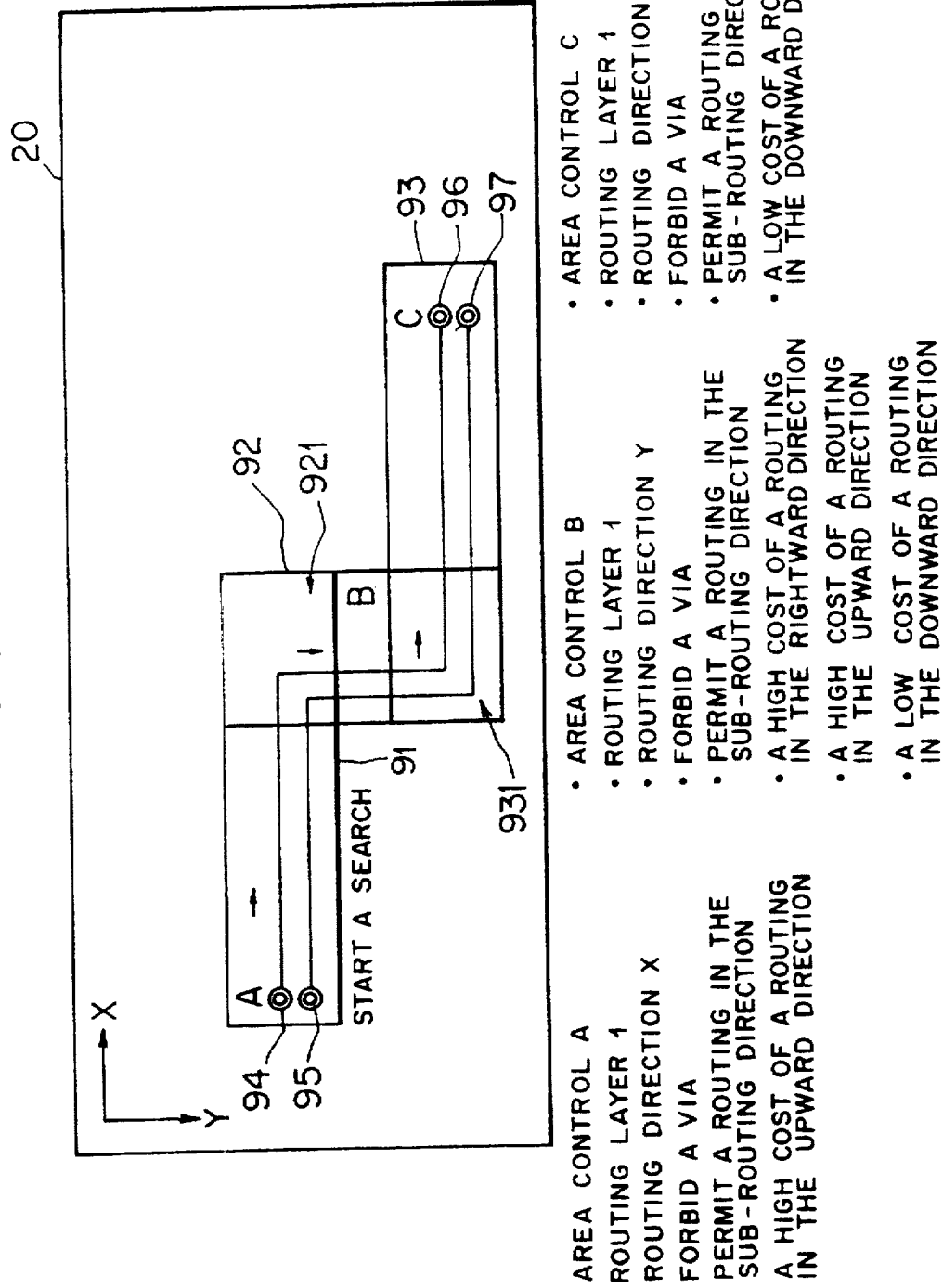

AUTOMATIC ROUTING METHOD AND AUTOMATIC ROUTING APPARATUS

This application is a continuation of application Ser. No. 08/521,424, filed Aug. 30, 1995, now abandoned Jan. 20, 1998.

BACKGROUND OF THE INVENTION

(1) Field of the Invention

The present invention relates to an automatic routing method and an automatic routing apparatus used for determining a route of a wiring pattern in order to automatically route a wiring pattern within a wiring area of an object of a wiring design such as a large scale integrated circuit (LSI), a multichip module (MCM), a printed wiring board (PWB), etc.

High-density mounting and placement of parts, and short-term wiring on signal layers of a small number are required in fabrication of recent LSI, MCM, PWB, etc. Such requirement largely decreases a degree of freedom in design of placing positions of the parts or wiring positions between the parts. For this, it becomes very difficult to solve various routing problems with one fixed algorithm. There is thus a necessity to establish a high-performance automatic routing technique.

(2) Description of the Related Art

Methods referred as line search method and maze method are well known as automatic routing techniques used to automatically route a wiring pattern on a wiring board such as a printed wiring board to determine the wiring pattern.

In the line search method, determination of a wiring route is performed as follows. First, a straight line called the first probe line is drawn in a suitable direction from a pin (a part pin) that is a start point toward a pin that is an end point within a wiring area. If this straight line does not reach the pin that is the end point, a straight line called the second probe line which crosses this line at right angles and is in a direction approaching the pin that is the end point is further drawn from a suitable position on this straight line.

While these first and second probe lines do not reach the pin that is the end point, the third, fourth, . . . lines are drawn one by one in the similar manner. When the probe line reaches the pin that is the end point, a wiring route of a wiring pattern is determined on the basis of a route along each of the probe lines having been drawn.

In the maze method, determination of a wiring route is performed as follows. In the maze method, meshes, a basic unit of each of which is a pattern width of a wiring pattern, are supposed within a wiring area of an object of a wiring design such as a printed wiring board. A wave (a search wave) is then generated from a pin that is a start point toward a pin that is an end point. A route on which the wave has traveled is stored in the order of mesh units. When the wave reaches the pin that is the end point, positions of stored meshes through which the wave has passed are traced back to determine a wiring route of a wiring pattern.

However, recent very high-density mounting of a wiring design object such as a printed wiring board, LSI, or the like demands severe physical, electrical design conditions. It is sometimes happen that a long time automatic routing in various methods such as the above line search method, the maze method, etc. cannot bring the most suitable wiring that the designer expects, or leaves a large number of unrouted portions.

The present situation requires manual routing and correction to cope with such unrouted portions. As a result, it is impossible in many cases to finish all routing work within a scheduled design period after all.

SUMMARY OF THE INVENTION

To overcome the above problem, an object of the present invention is to provide an automatic routing method and an automatic routing apparatus which can provide an optimum automatic routing without an assistance of the operator even under severe design conditions due to high-density mounting of an object of a wiring design.

The present invention therefore provides an automatic routing method for determining a route of a wiring pattern in order to automatically route said wiring pattern within a wiring area of an object of a wiring design comprising the steps of setting in advance a routing controlled area in which an automatic routing is performed under specific routing control conditions within said wiring area, and automatically routing under said specific routing control conditions within said routing controlled area.

The present invention also provides an automatic routing apparatus for determining a route of a wiring pattern in order to automatically route said wiring pattern within a wiring area of an object of a wiring design comprising an area input unit for inputting area information for setting a routing controlled area in which an automatic routing is performed under specific routing control conditions within said wiring area, a condition input unit for inputting condition information for designating said specific routing controlling conditions in said routing controlled area set according to the area information inputted from said area input unit, and an automatic routing unit for automatically routing under said specific routing control conditions designated according to the condition information inputted from said condition input unit within said routing controlled area.

According to the automatic routing method and the automatic routing apparatus of this invention, a routing controlled area in which an automatic routing is performed under specific routing control conditions is set within a wiring area of an object of a wiring design. Within the routing controlled area, a routing is automatically performed under the specific routing control conditions so that a control of the automatic routing may be set and designated in detail within a wiring area of an object of the routing design. This invention has an advantage that an optimum automatic routing is feasible in a short period of time even under severe conditions for a wiring design due to high-density mounting of an object of the wiring design.

BRIEF DESCRIPTION OF THE DRAWINGS

FIG. 5 illustrates an example of an operation of the automatic routing performed when a cost of travel direction is designated as a routing control condition in the automatic routing apparatus according to the embodiment;

FIG. 9 illustrates an example of an operation of the automatic routing performed when "forbid a routing" is designated as a routing control condition in the automatic routing apparatus according to the embodiment;

FIG. 13 illustrates an example of a manner of designation when a travel direction of a routing is designated as a routing control condition in the automatic routing apparatus according to the embodiment;

FIG. 15 illustrates an example of an operation of the automatic routing in the case of a crank wiring by the automatic routing apparatus according to the embodiment.

DESCRIPTION OF THE PREFERRED EMBODIMENT (a) Description of Aspect of the Invention FIG. 1 is a block diagram showing an aspect of this invention. In FIG. 1, reference numeral 1 denotes an automatic routing apparatus which determines a route of a wiring pattern so as to perform an automatic routing in order to automatically route the wiring pattern within a wiring area of an object of a wiring design. As shown in FIG. 1, the automatic routing apparatus 1 has an area input unit 2, a condition input unit 3 and an automatic routing unit 4.

Figure 1:
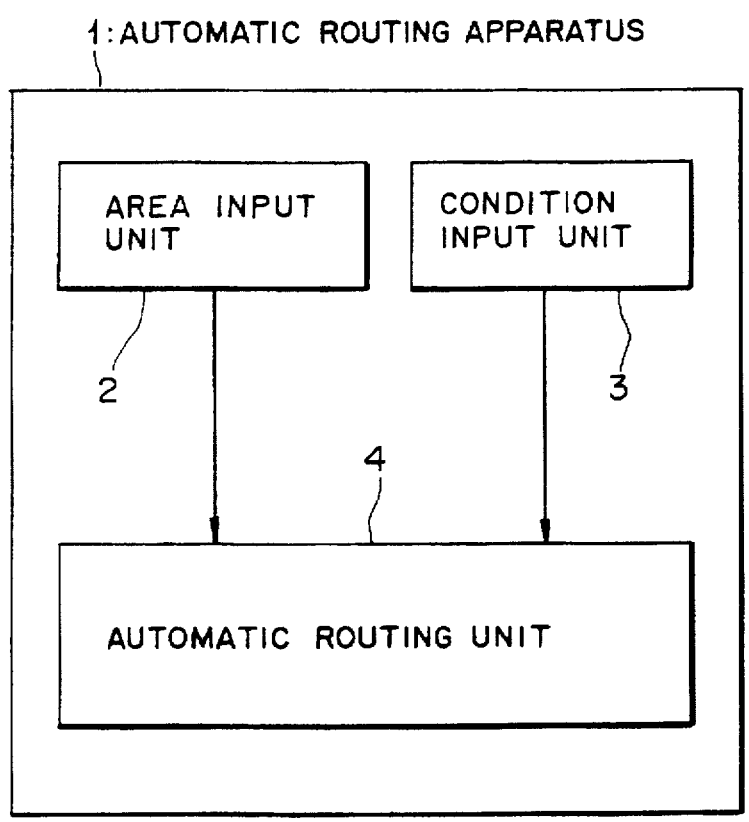
FIG. 1 is a block diagram showing an aspect of the invention.

The area input unit 2 is used to input area information for setting a routing controlled area in which an automatic routing is performed under specific routing control conditions within a wiring area of an object of a wiring design. The condition input unit 3 is used to input condition information for designating the specific routing control conditions in the routing controlled area set according to the area information inputted from the area input unit 2.

The automatic routing unit 4 automatically routes under the specific routing control conditions designated according to the condition information inputted from the condition input unit 3 within the routing controlled area in which an automatic routing is performed under the specific routing control conditions.

In the automatic routing apparatus 1 applied the automatic routing method described above of this invention thereto, a routing controlled area in which an automatic routing is performed under specific routing control conditions is set within a wiring area of an object of a wiring design by inputting area information into the area input unit 2, and the above specific routing control conditions are designated by inputting condition information into the condition input unit 3. In other words, the routing controlled area in which an automatic routing is performed under the specific routing control conditions is set in detail within the wiring area of an object of the wiring design.

The automatic routing unit 4 automatically routes under the specific routing control conditions designated according to the condition information inputted from the condition input unit 3 within the routing controlled area set as above. It is thus possible to perform an automatic routing set and designated in detail within the wiring area of an object of a wiring design.

The automatic routing method and the automatic routing apparatus of this invention have a feature that an optimum automatic routing is feasible in a short period of time even under severe wiring design conditions due to high-density mounting of an object of the wiring design.

If plural routing controlled areas overlapping each other are set by the area input unit 2 and the condition input unit 3 at that time, a priority determining unit is provided to determine a priority of each of the routing controlled areas. The automatic routing unit 4 automatically routes under specific control conditions in a routing controlled area having the highest priority determined by the priority determining unit within an area in which the plural routing controlled areas overlap.

In the automatic routing method and the automatic routing apparatus of this invention, if plural routing controlled areas overlapping each other are set according to the area information inputted from the area input unit 2, a priority of each of the routing controlled areas is set, and an automatic routing is performed under specific routing control conditions in a routing controlled area having the highest priority within an area in which the plural routing controlled areas overlap. It is thus possible to set and designate a control of an automatic routing with less area information and condition information within an area in which plural routing controlled areas overlap.

According to the automatic routing method and the automatic routing apparatus of this invention, it is possible to perform an optimum automatic routing at a high rate without a necessity of setting and designating a control of the automatic routing in overlapping routing controlled areas according to individual area information and condition information.

In practice, determination of a priority by the above priority determining unit is performed in the order in which plural routing controlled areas are set by the area input unit 2 and the condition input unit 3.

If plural routing controlled areas overlapping each other are set, a priority of each of the routing controlled areas is determined in the order set so that a priority of each of the plural routing controlled areas may be determined without using individual information for setting the priority.

According to the automatic routing method and the automatic routing apparatus of this invention, it is possible to perform an optimum automatic routing at a higher rate without a necessity of individual information for determining the priority.

(b) Description of Embodiment of the Invention

Now, description will be made of an embodiment of this invention referring to the drawings.

Figure 2:
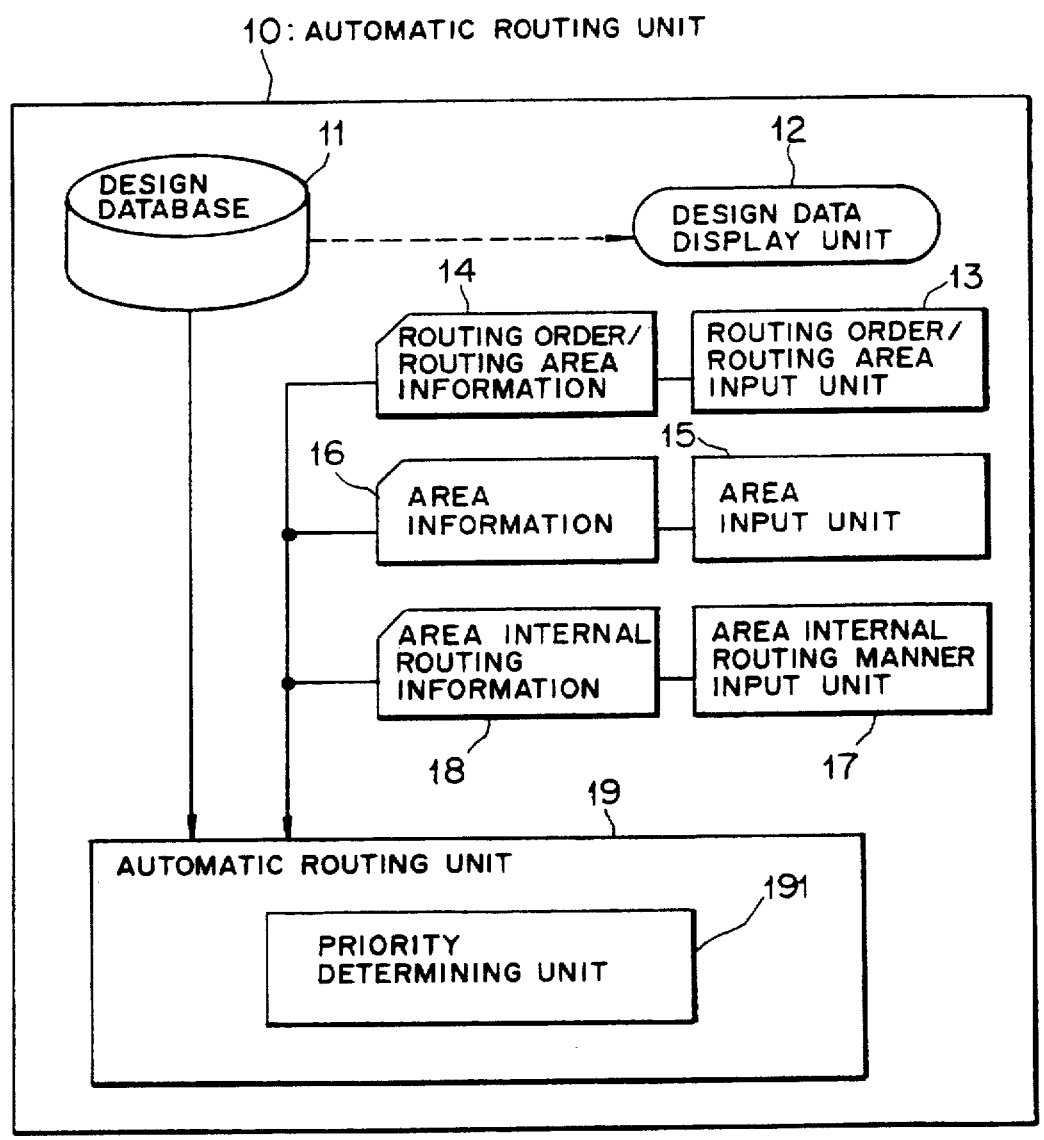
FIG. 2 is a block diagram of an automatic routing apparatus according to an embodiment of this invention.

FIG. 2 is a block diagram showing a structure of an automatic routing apparatus as an embodiment of this invention. In FIG. 2, reference numeral 10 denotes an automatic routing apparatus, 11 denotes a design database, 12 denotes a design data display unit, 13 denotes a routing order/routing area input unit, 14 denotes routing order/routing area information which is output data from the routing order/routing area input unit 13, 15 denotes an area input unit, 16 denotes area information which is output data from the area input unit 15, 17 denotes an area internal routing manner input unit, 18 denotes area internal routing information which is output data from the area internal routing manner input unit 17, and 19 denotes an automatic routing unit.

The design data base 11 is served to store therein routing design information about an object of a wiring design such as a printed circuit board. The design data display unit 12 displays the routing design information on a screen of a personal computer or the like.

The routing order/routing area input unit 13 receives routing pattern information regarding in which area and in which procedure the printed circuit board is routed, which is inputted from a personal computer or the like, and outputs the received information as the routing order/routing area information 14 to the automatic routing unit 19 described later.

The area input unit (an area input unit) 15 is served to input area information (area information) 16 for setting a routing controlled area in which an automatic routing is performed under routing control conditions such as costs, etc., which will be described later, within a routed area on the printed circuit board. The area internal routing manner input unit (a condition input unit) 17 is served to input area internal routing information [condition information: coefficients in a routing formula (a cost function) described later] for designating routing control conditions within the routing controlled area set by the area information 16 inputted from the area input unit 15. Incidentally, these area information 16 and the area internal routing information 18 are inputted through a personal computer or the like.

The automatic routing unit 19 determines a wire route of a wiring pattern by tracing back a route of a wave (a search wave) generated at a wiring pin (a start pin) that should be a start point between two points that should be routed and advancing from the wiring pin (the start pin) toward a wiring pin (an end pin) that should be an end point so as to automatically route the two points. The automatic routing unit 19 performs an automatic routing under the routing control conditions designated according to the area internal routing information 18 inputted from the area internal routing manner input unit 17 within the routing controlled area set according to the area information 16 inputted from the area input unit 15.

The automatic routing unit 19 has a priority determining unit 191 for determining a priority of each of routing controlled areas if the area input unit 15 and the area internal routing manner input unit 17 set plural routing controlled areas overlapping each other on a printed circuit board. In such case, the automatic routing unit 19 performs an automatic routing according to a routing manner designated in a routing controlled area having the highest priority determined by the priority determining unit 191 within an area in which plural routing controlled areas overlap.

Meanwhile, the above routing control condition is designated with a value (a cost) obtained from a function referred as a cost function. The cost function is expressed as:

$$\text{Cost function} = Cl \cdot L + Cv \cdot V + Cs \cdot S + Ct \cdot T + Cc \cdot C + Ce \cdot E + Cb \cdot B + Cp \cdot P + Cu \cdot U + Cd \cdot Dn \quad (1)$$

where

L: a distance for which a wave has traveled from a wiring pin that is a start point;

Cl: a coefficient of the distance L;

V: the number of VIAs;

Cv: a coefficient of the number of the VIAs V;

S: a distance for which the wave has traveled in a sub-routing direction;

Cs: a coefficient of the distance S;

T: the number of excesses of a capacity;

Ct: a coefficient of the number of excesses of a capacity T;

C: the number of crossings of wires;

Cc: a coefficient of the number of crossings of wires C;

E: a priority cost of a bifurcated route;

Ce: a coefficient of the priority cost of a bifurcated route E;

B: the number of curves of a wire;

Cb: a coefficient of the number of curves of a wire B;

P: a length of a parallel lines;

Cp: a coefficient of the length of the parallel lines P;

U: the number of passings of a wave in the vicinity of an unrouted wiring pin;

Cu: a coefficient of the number of passings of a wave in the vicinity of an unrouted wiring pin U;

Dn: the number of travels of a wave in an upward, downward, leftward or rightward direction on a sheet of paper (n is each direction); and Cd: a coefficient of the number of travels of a wave Dn.

Here, the cost is condition information for designating a routing manner in a wiring area (a routing controlled area) to which a cost is set by controlling a propagation speed of a search wave propagated from a wiring pin that is a start point toward a wiring pin that is an end point in a routing by the automatic routing unit 19. In this case, if each coefficient of the cost function is inputted to the area internal routing manner input unit 17 to increase the cost, it becomes difficult for the search wave to advance. Conversely, if the cost is decreased, it becomes easy for the search wave to advance.

Accordingly, it is difficult for the search wave to advance within a wiring area under conditions where a large cost is set so that the search wave cannot easily reach the end pin. As a result, it becomes difficult to route within this wiring area. Conversely, within a wiring area under conditions where a small cost is set, the search wave can easily advance so that it is easy for the search wave to reach the end pin. As a result, the routing is easy within this wiring area.

Figure 3:
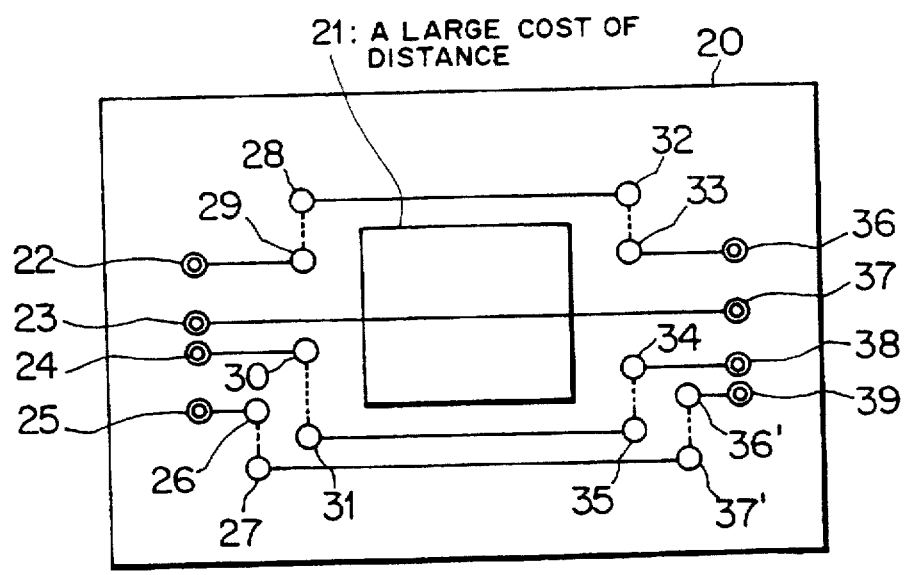
FIG. 3 illustrates an example of an operation of an automatic routing performed when a cost of distance is designated as a routing control condition in the automatic routing apparatus according to the embodiment.

For example, if a coefficient of a distance "Cl" is set at a large value, a cost of the distance increases as the search wave advances so that a routing becomes difficult within an area in which a large coefficient of a distance "Cl" is set, as above. As shown in FIG. 3, if the operator inputs area information for setting an area 21 within a wiring area on a printed circuit board 20 through the area input unit 15 and a coefficient of a distance "Cl" whose value is large so as to set a large cost of a distance within the area 21 through the area internal routing manner input unit 17, the automatic routing unit 19 generates search waves, for example, from wiring pins 22 through 25 toward wiring pins 36 through 39 in order to determine wiring routes of a wiring pattern within the wiring area on the printed circuit board 20 so as to automatically route.

The search waves linearly advance toward the wiring pins 36 through 39. However, it is difficult for the search waves to advance within the area 21 in which a large cost of a distance is set. In consequence, the automatic routing unit 19 determines, first, routes of search waves via an area excepting the area 21, which reach the end pins (the wiring pins 36, 38 and 39) to automatically route. After that, the automatic routing unit 19 determines a route as a wiring route of a search wave which reaches the wiring pin 37 via the area 21 when a routing in an area excepting the area 21 becomes difficult so as to automatically route a path through the area 21.

Namely, the routing control conditions are so set to an area (the area 21) in which a high-density routing is expected that a routing is difficult within the area 21 by setting a large cost of a distance to the area 21, as above, whereby the automatic routing unit 19 performs a routing control so as to secure a room for a wiring area within the area 21. Incidentally, reference numerals 28 through 35, 36' and 37' are VIAs, which will be described later.

If a large coefficient of VIAs Cv is set in an area, the number of VIAs within the area (the number of shifts to another wiring layers) is decreased. In addition, if a coefficient of a sub-routing direction Cs is set at a large value in an area, a routing in the sub-routing direction within the area becomes difficult.

The VIA is, for example, a hole formed in the printed circuit board in order to extend a wire from the front surface to the back surface or from the back surface to the front surface thereof. The sub-routing direction means, for example, a Y direction if a direction in which a routing is mainly performed on an X-Y plane (a main-routing direction) is an X direction.

If a large coefficient Ct of the number of excesses of a capacity is set, it becomes difficult to route in an area in which wires are routed in a high density. If a large coefficient of the number of crossings Cc is set, a routing crossing another wiring pattern becomes difficult. If a large coefficient of a bifurcating route "Ce" is set to increase a priority cost of a bifurcated route, a routing is led in a direction of a smaller cost.

Figure 4A:
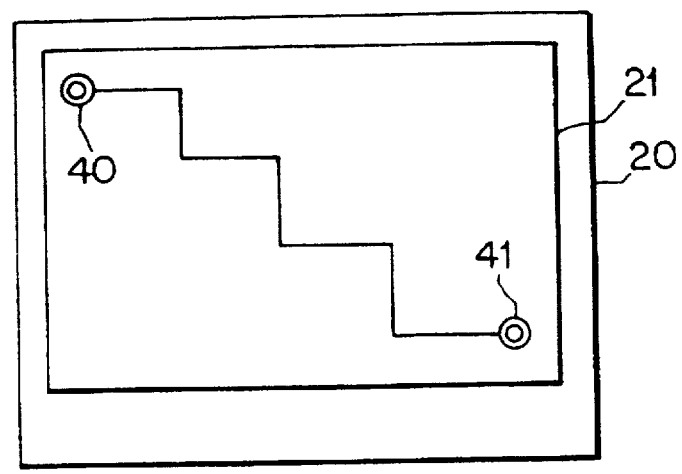
FIGS. 4(a) and 4(b) illustrate examples of an operation of the automatic routing performed when a cost of curve is designated as a routing control condition in the automatic routing apparatus according to the embodiment.

Further, if a large coefficient of the number of curves is set, the larger the number of curves of the wiring B is, the larger a cost of a curve is. As a result, the routing is performed with curves of a smaller numbers. For example, if the operator inputs area information for setting the area 21 in which the number of turns of a wire is increased under a control within a wiring area on the printed circuit board 20 through the area input unit 15, and sets a small coefficient of curves Cb (0, for example) within the area 21 through the area internal routing manner input unit 17, the automatic routing unit 19 determines a route having a larger number of turns as a wiring route out of routes along which the search wave has passed so as to perform a routing, as shown in FIG. 4(a).

Figure 4B:
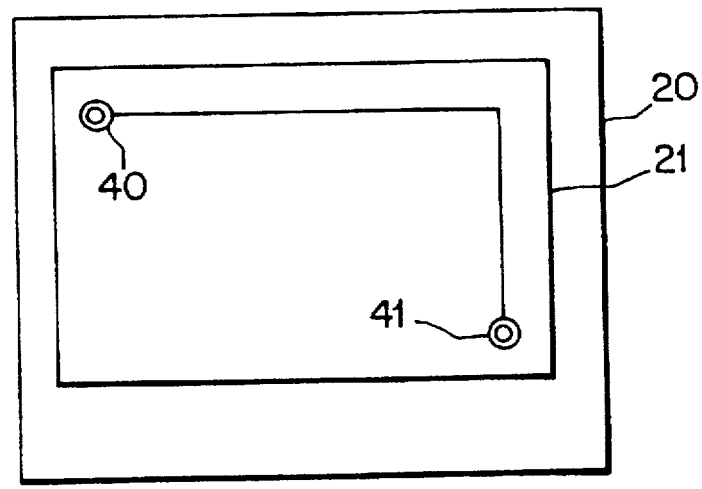

Conversely, if a large coefficient of curves Cb is set to the area 21 by the area internal routing manner unit 17, the automatic routing unit 19 determines a route having a fewer number of curves as a wiring route out of routes along which the search wave has passed so as to perform the routing, as shown in FIG. 4(b).

If a large coefficient of a length of parallel lines Cp is set, a parallel cost increases as a distance for which wires are drawn in parallel increases. In consequence, a routing is so controlled as to prevent the wires from being drawn in parallel for a long distance. Namely, an automatic routing can be so controlled as to avoid an effect of a crosstalk noise induced by which wires are formed in parallel for a long distance.

If a large coefficient of the number of passings of a wave in the vicinity of an unrouted wiring pin Cu, the larger the number of passings of the search wave in the vicinity of an unrouted wiring pin is, the larger a cost of an unrouted wire is so that a routing in the vicinity of the unrouted wiring pin becomes difficult. Namely, an unrouted wiring pin has a high probability to be drawn a wire therefrom in the future. For this, a cost in a routing area in the vicinity of an unrouted wiring pin is set at a large value to prevent the search wave from entering into a wiring area in the vicinity of an unrouted pin and a wiring route from being determined within that area so that a certain wiring area may be secured.

If the travel coefficient in the upward, downward, rightward or leftward direction (X or Y direction on an X-Y plane) Cd is adjusted to vary a travel cost in the upward, downward, leftward or rightward direction, a routing in the upward, downward, leftward or rightward direction is controlled according to this.

For example, assuming that a surface mounting device (SMD: Surface Mounting Device) pad 42 is provided on the printed circuit board 20 and the operator wants to control the automatic routing to route in the rightward direction on the sheet of paper from the SMD pad 42, as shown in FIG. 5. It is sufficient for the operator to set a wiring area in the vicinity of the SMD pad 42 as a routing controlled area 43 through the area input unit 15, besides designating a travel cost of the search wave in the leftward direction on the sheet of paper at 100 as a routing control condition within the area 43 through the area internal routing manner input unit 17 and designating a travel cost of the search wave in the rightward direction on the sheet of paper at 0, whereby the automatic routing unit 19 automatically routes in the rightward direction on the sheet of paper within the area 43, preferentially.

Figure 6:
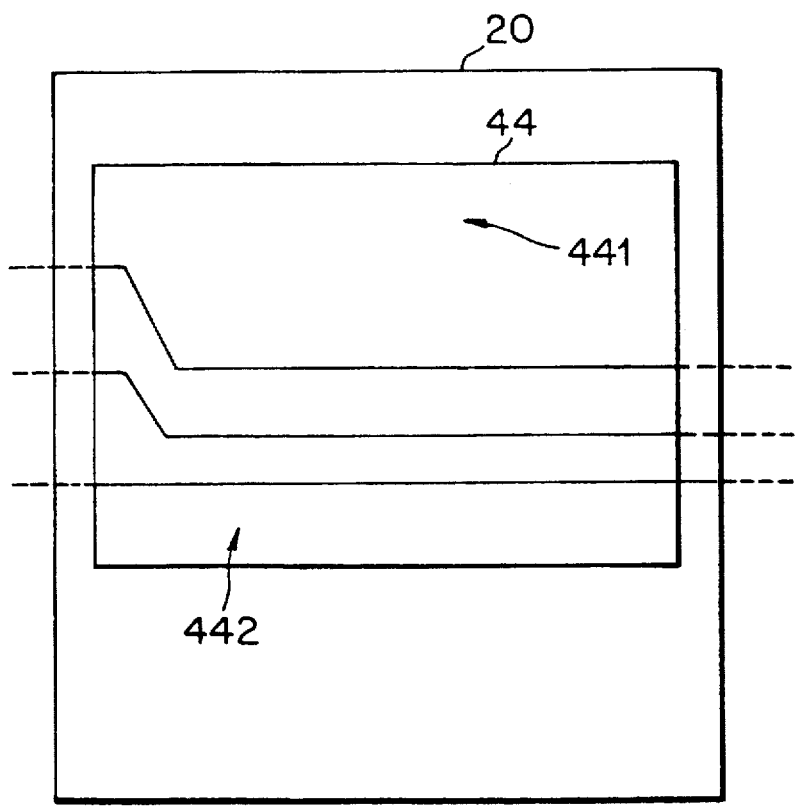
FIG. 6 illustrates an example of an operation of the automatic routing performed when a cost of travel direction is designated as a routing control condition in the automatic routing apparatus according to the embodiment.

For example, if the operator wants to control the automatic routing unit 19 to put wires aside in a certain direction within a specific area (the routing controlled area) 44 on the printed circuit board 20, as shown in FIG. 6, the operator needs only to set the area information for setting the routing controlled area 44 through the area input unit 15, set a large travel cost in the upward direction on the sheet of paper as condition information for controlling the routing within the routing controlled area 44, and set a small travel cost in the downward direction on the sheet of paper. The automatic routing unit 19 thereby so routes the wires that the wires aggregate densely on a side of a lower area 442 rather than a side of an upper area 441 within the routing controlled area 44.

In the automatic routing apparatus 10 according to this embodiment, it is possible to designate routing control condition applied to a routing controlled area by directly inputting (1) routing layer designating information, (2) routing forbidding information, (3) VIA forbidding information, (4) routing in the sub-routing direction forbidding information, (5) information in terms of a travel in the upward, downward, rightward or leftward direction, (6) capacity excess forbidding information, (7) crossing forbidding information, (8) information in terms of alteration of the main-routing direction, etc. as condition information excepting the above costs through the area internal routing manner input unit 17.

For example, if the operator inputs (1) routing layer designating information through the area internal routing manner input unit 17, it is possible to route on either the front surface or the back surface of the printed circuit board within the routing controlled area set according to the area information inputted to the area input unit 15. If the operator inputs (2) routing forbidding information through the area internal routing manner input unit 17, it is possible to forbid a routing within the routing controlled area.

If the operator inputs (3) VIA forbidding information through the area internal routing manner input unit 17, it is possible to forbid the VIA to be formed (that is, a wiring from the front surface to the back surface or from the back surface to the front surface of the printed circuit board, for example) within the routing controlled area. If the operator inputs (4) routing in the sub-routing direction forbidding information through the area internal routing manner input unit 17, it is possible to forbid a routing in the sub-routing direction within the routing controlled area. If the operator inputs (5) information in terms of a travel in the upward, downward, leftward or rightward direction through the area internal routing manner input unit 17, it is possible to designate a direction of a routing (the upward, downward, leftward or rightward direction on the sheet of paper) within the routing controlled area.

If the operator inputs (6) capacity excess forbidding information through the area internal routing manner input unit 17, it is possible to forbid a routing causing an excess of capacity within the routing controlled area. If the operator inputs (7) crossing forbidding information through the area internal routing manner input unit 17, it is possible to forbid a crossing of wires within the routing controlled area. If the operator inputs (8) information in terms of alteration of the main-routing direction through the area internal routing manner input unit 17, it is possible to alter the main-routing direction within the routing controlled area.

Hereinafter, detailed description will be made by way of an example where a routing controlled area in which a routing is forbidden is set with a use of (2) routing forbidding information so as to perform an automatic routing.

Figure 7:
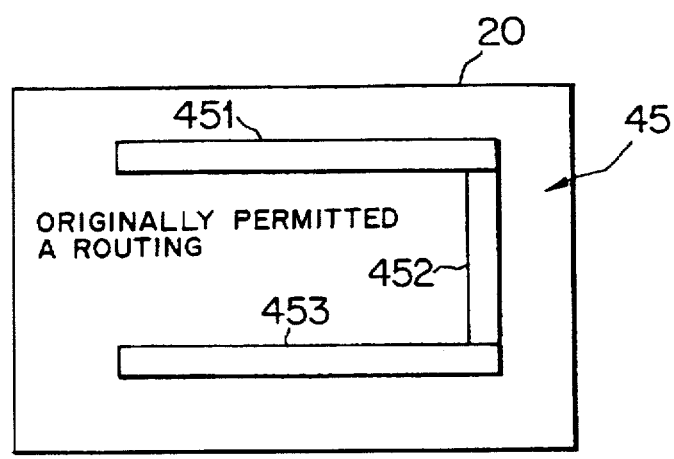
FIG. 7 illustrates an example of an operation of the automatic routing performed when "forbid a routing" is set as a routing control condition in the automatic routing apparatus according to the embodiment.
Figure 8:
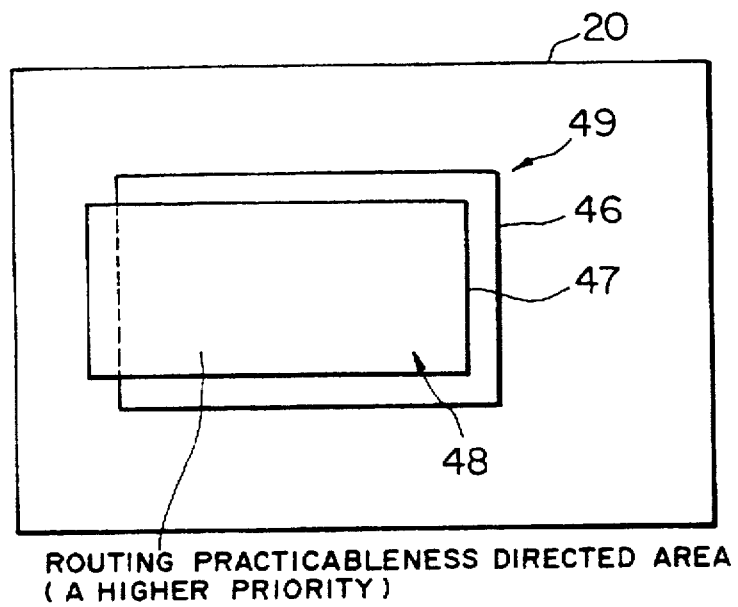
FIG. 8 illustrates an example of an operation of the automatic routing performed when a routing forbidden area is set by setting plural overlapping routing controlled areas in the automatic routing apparatus according to the embodiment.

Now, supposing that an area in which no routing is desired is set as a routing forbidden area 45 on the printed circuit board 20, as shown in FIG. 7. According to the manner of designation in the routing method described above, three rectangular areas 451 through 453 are successively set as the routing controlled areas by the area input unit 15, the routing forbidding information are successively inputted as information used to designate routing control conditions for the routing controlled areas 451 through 453 through the area internal routing manner input unit 17, thereby setting the routing controlled area 45 in which a routing is forbidden.

When the automatic routing unit 19 automatically routes, a routing is carried out in a wiring area excepting the routing controlled area 45, but no routing is carried out in the routing controlled area 45.

Since the routing controlled area 45 is set by designating the three routing controlled areas 451 through 453 as described above, it is necessary to input three sorts of area information and routing forbidding information through the area input unit 15 and the area internal routing manner input unit 17, respectively. This is not efficient.

According to the automatic routing apparatus 10 of this embodiment, the operator inputs area information for setting two overlapping areas 46 and 47 as the routing controlled area on the printed circuit board 20 through the area input unit 15, thereby setting an area in which a routing is forbidden, similar to that shown in FIG. 7. In other words, by inputting the routing forbidding information [(2)] for designating a routing manner in the routing controlled area 46 and routing practicableness designating information as information for designating a routing manner in the routing controlled area 47, the operator can designate the two areas 46 and 47 so that an automatic routing by the automatic routing unit 19 is forbidden in the routing controlled area 46, but an automatic routing is permitted in the routing controlled area 47.

At that time, the priority determining unit 191 determines priorities of the routing controlled areas 46 and 47 in the order set by inputting the area information into the area input unit 15, where the routing controlled area 47 having been set later is set at a higher priority.

As a result, in the area 48 in which the two routing controlled areas 46 and 47 overlap, the routing control condition (a routing practicableness) designated in the routing controlled area 47 having a higher priority by the automatic routing unit 19 takes a preference so that the routing forbidden area 49 similar to the routing forbidden area 45 having been described with reference to FIG. 7 may be set on the printed circuit board 20.

The automatic routing unit 19 performs an automatic routing according to the routing manner designated in the routing controlled areas 46 and 47. As a result, a routing is carried out in a wiring area excepting the routing forbidden area 49 as shown in FIG. 9, for example.

If the routing controlled areas 46 and 47 overlapping each other are set in the automatic routing apparatus 10 of this embodiment, a priority of each of the routing controlled areas 46 and 47 is set by the priority determining unit 191, then an automatic routing is performed according to routing control conditions designated in the routing controlled area 47 having the highest priority in an area in which the routing controlled areas 46 and 47 overlap.

In FIG. 9, a double circle (⊚) represents a wiring pin (a PIN), while a circle (○) represents a VIA. A solid line extending from the wiring pin represents a wiring on the front surface of the printed circuit board 20, while a broken line extending from a VIA represents a wiring on the back surface of the printed circuit board 20 through the formed VIA. If routing controlled areas more than one are set, an automatic routing is carried out according to routing control conditions designated in a routing controlled area having the highest priority.

Figure 10:
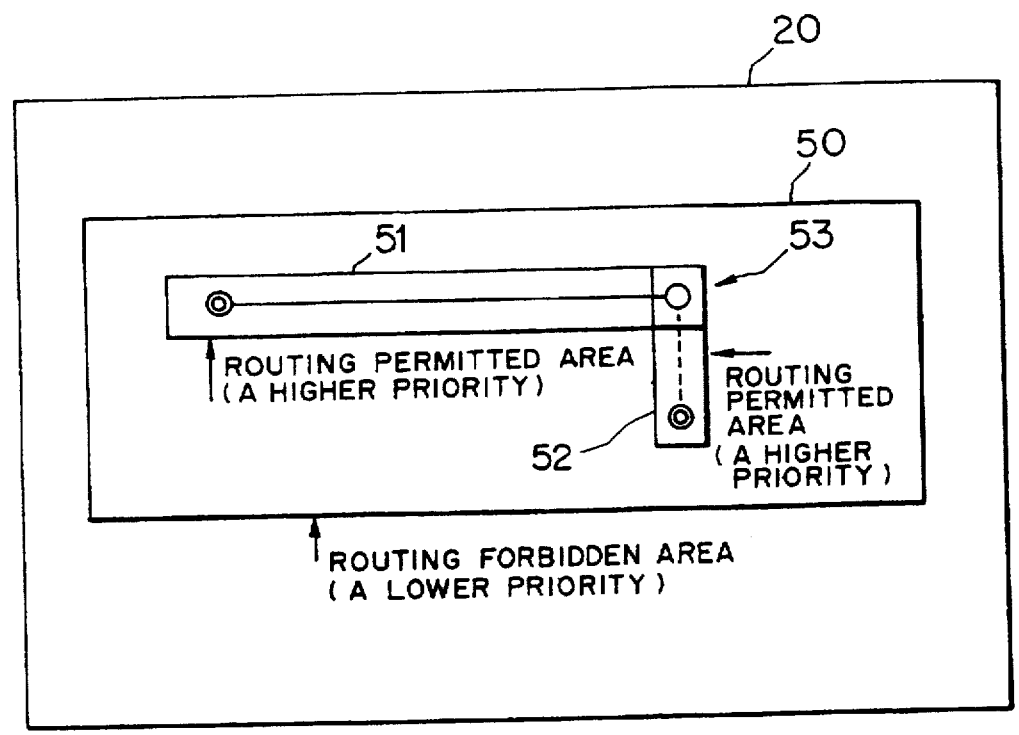
FIG. 10 illustrates an example of an operation of the automatic routing performed when a routing permitted area is set by setting plural overlapping routing controlled areas in the automatic routing apparatus according to the embodiment.

Conversely, if an area to be routed is set as a routable area 53 on the printed circuit board 20, as shown in FIG. 10, the operator inputs the area information through the area input unit 15 to set routing controlled areas 50 through 52, then inputs routing forbidding information for forbidding a routing in the routing controlled area 50 through the area internal routing manner input unit 17 to designate the routing controlled area 50 as a routing forbidden area. Further, the operator inputs routing permitting information through the area internal routing manner input unit 17 to permit a routing within the routing controlled areas 51 and 52 so as to designate the routing controlled areas 51 and 52 as routing permitted areas.

The priority determining unit 191 so sets priorities of the routing controlled areas 50 through 52 that the routing controlled areas 51 and 52 have higher priorities than the routing controlled area 50 according to the order in which the routing controlled areas 50 through 52 are set.

As a result, the automatic routing unit 19 performs an automatic routing according to a routing control condition (a routing practicableness) designated in the routing controlled areas 51 and 52 having the higher priorities within the routing controlled areas 50 through 52 overlapping to route in only the routing controlled areas 51 and 52.

In the above case, it is possible to largely reduce a volume of data when routing control conditions in the routing controlled areas 51 and 52 are designated, and largely speed up a process such as a process (a card processing) to make a file necessary to control an automatic routing by the automatic routing unit 19.

According to this embodiment, if VIA forbidding information is designated as a routing control condition in the automatic routing apparatus 10, it is possible to so control the automatic control unit 19 that the automatic control unit 19 automatically routes only one layer of a printed circuit board without forming a "VIA" (only the front surface or the back surface of the printed circuit board).

Figure 11A:
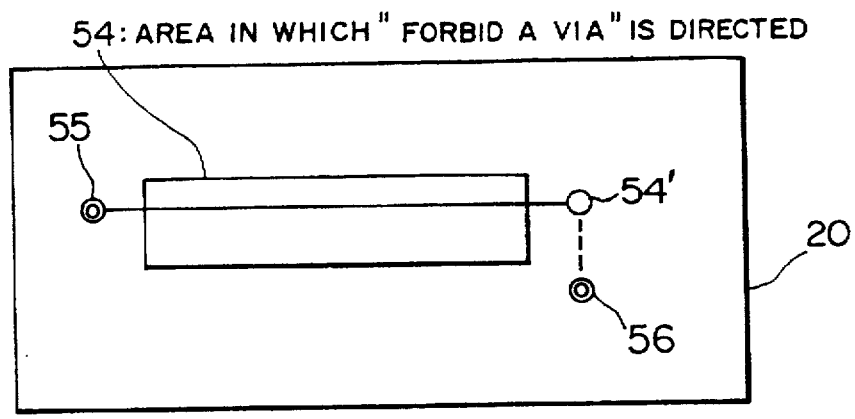
FIGS. 11(a) and 11(b) illustrate examples of operations of the automatic routing performed when "forbid a VIA" is designated as a routing control condition in the automatic routing apparatus according to the embodiment.
Figure 11B:
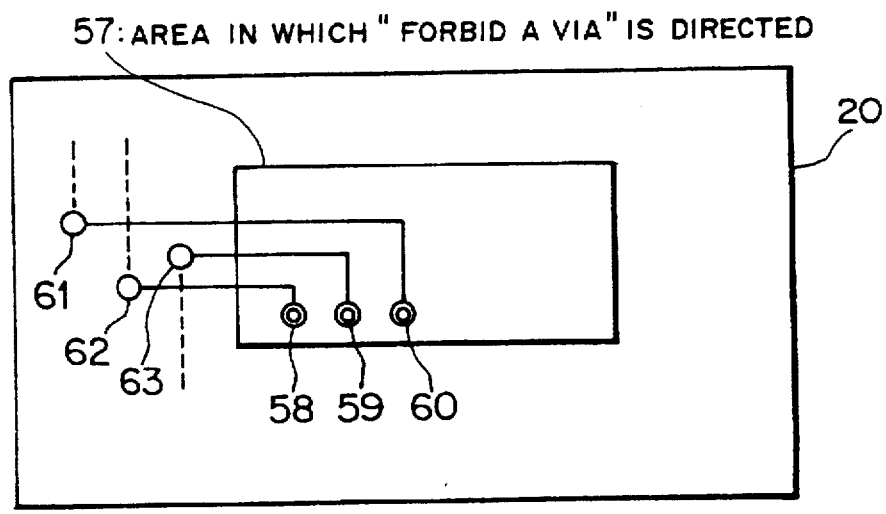

More specifically, as shown in FIGS. 11(a) and 11(b), the operator inputs area information for setting routing controlled areas 54 and 57 in which no "VIA" is desired on the printed circuit board 20 is inputted through the area input unit 15 to set the routing controlled areas 54 and 57, and inputs the VIA forbidding information [(3)] through the area internal routing manner input unit 17, thereby so designating the routing controlled areas 54 and 57 as to prevent "VIA" from being formed therein.

As shown in FIG. 11(a), the automatic routing unit 19, for example, routes on the front surface of the sheet of paper of the printed circuit board 20 from a PIN 55 toward a PIN 56 without forming a VIA within the routing controlled area 54. In a wiring area excepting the routing controlled area 54, the automatic routing unit 19 forms a VIA 54' to automatically route a path between the PIN 55 and the PIN 56.

Similarly, the automatic routing unit 19, as shown in FIG. 11(b), automatically routes paths extending from PINs 58 through 60 on the front surface of the sheet of paper of the printed circuit board 20 without forming a VIA, and forms VIAs 61 through 63 in a wiring area excepting the routing controlled area 57 to perform an automatic routing on the back surface of the sheet of paper of the printed circuit board 20.

In this case, it is possible to perform an automatic routing at a high rate since a wasteful search for VIAs can be omitted within the routing controlled area 54 or 57.

If a routing control condition designated to a specific routing controlled area is designated as a travel information in the upward, downward, leftward, or rightward direction, it is possible in the automatic routing apparatus 10 of this embodiment to automatically route in a designated direction within the specific routing controlled area.

Figure 12:
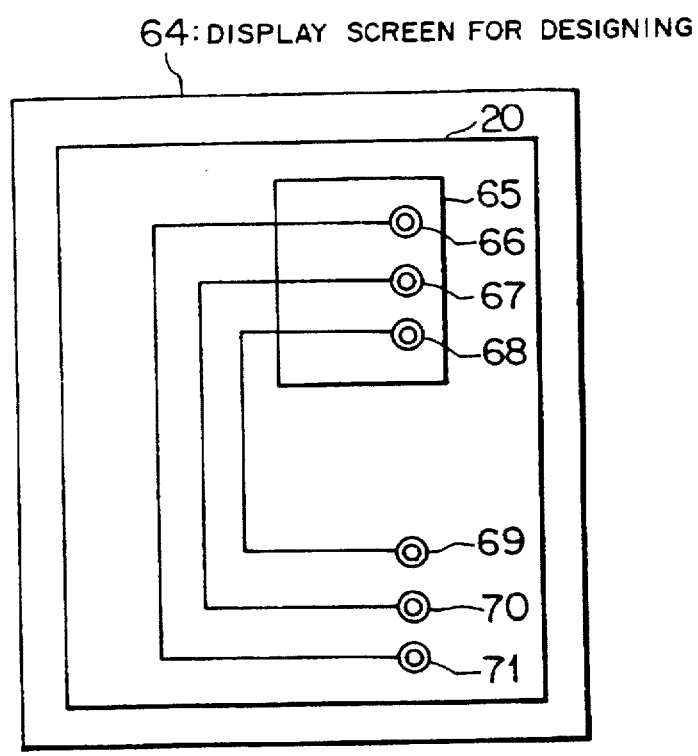
FIG. 12 illustrates an example of an operation of the automatic routing performed when a travel direction of a routing is designated as a routing control condition in the automatic routing apparatus according to the embodiment.

For example, assuming now that a design display screen 64 as shown in FIG. 12 and a routing manner setting screen 72 as shown in FIG. 13 are displayed on a screen of a personal computer or the like, a diagram for designing the printed circuit board 20 that is an object of a wiring design is displayed on the design display screen 64, and buttons 73 through 76 used to designate a direction of a routing are displayed on the routing manner setting screen 72.

If the operator wants to route paths between the wiring pins 66 through 68 and the wiring pins 69 through 71, respectively, as shown in FIG. 12, the operator inputs area information for setting a routing controlled area (an area including the wiring pins 66 through 68) within the wiring area of the printed circuit board 20 through the area input unit 15 to set the routing controlled area 65. The operator then inputs information for designating a leftward direction of the routing on the sheet of paper as a routing control condition in the routing controlled area 65 through the area internal routing manner input unit 17 by clicking the button 75 on the routing manner setting screen 72 with a mouse or the like, as shown in FIG. 13. If the operator wants to route in the upward direction, the downward direction or the rightward direction on the sheet of paper within the routing controlled area 65, it is sufficient that the operator, for example, clicks the button 73, 74 or 76 with a mouse.

In this case, the automatic routing unit 19, similarly, propagates search waves in the downward direction on the sheet of paper from the wiring pins 66 through 68 toward the wiring pins 69 through 71, respectively, to determine wiring routes. At that time, since the routing control condition is so designated as to route in the leftward direction on the sheet in the routing controlled area 65 at that time, the search waves are propagated, first, in the leftward direction on the sheet of paper from the wiring pins 66 through 68.

After that, when advancing in the leftward direction on the sheet of paper and passing through the routing controlled area 65, the search waves advance in the downward direction on the sheet of paper, which is a main-routing direction, until the search waves reach the wiring pins 69 through 71. When the search waves reach the wiring pins 69 through 71, the automatic routing unit 19 traces back routes along which the search waves have traveled to determine wiring routes. As a result of this, routes indicated by solid lines in FIG. 12 are determined as wiring routes so as to complete the automatic routing.

An operation of the apparatus when the apparatus performs an automatic routing in which routing control conditions within a routing controlled area is designated by mixedly using both the costs having been described above and condition information will be next described in detail by way of practical examples of automatic routings in the case of (1) L-shaped routing, and (2) crank routing.

(1) L-shaped Routing

Figure 14:
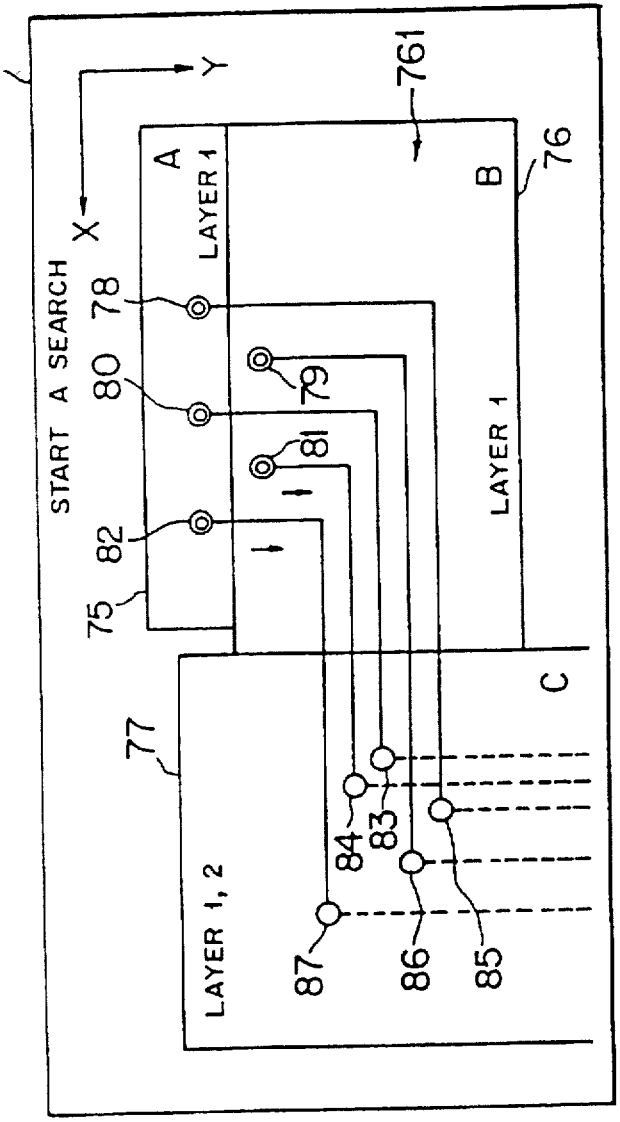
FIG. 14 illustrates an example of an operation of the automatic routing in the case of an L-shaped wiring by the automatic routing apparatus according to the embodiment.

As shown in FIG. 14, the operator inputs area information through the area input unit 15 in the case of an L-shaped wiring on the printed circuit board 20 to set routing controlled areas 75 through 77.

For example, the operator designates "routing layer: 1", "routing direction: Y", "forbid a VIA", "forbid a routing in the sub-routing direction" and "forbid a routing in the upward direction" as routing control conditions (area control A) in a routing controlled area 75. The operator next designates "routing layer: 1", "routing direction: X", "forbid VIA", "high cost of a routing in the sub-routing direction", "forbid a routing in the upward direction", "forbid a routing in the rightward direction", and "a low cost of a routing in the upward direction at a bifurcation of a route" as routing control conditions (area control B) in the routing controlled area 76 through the area internal routing manner input unit 17.

Similarly, the operator designates "routing layers: 1 and 2", routing directions: X and Y", "permit VIA", and "forbid a routing in the sub-routing direction" as routing controll conditions (area control C) in the routing controlled area 77 through the area internal routing manner input unit 17.

Incidentally, "routing layer" is used to designate a routing on the front surface or the back surface (channel) of the printed circuit board 20. In this embodiment, "1" represents a layer on the front surface of the printed circuit board 20, "2" represents a layer on the back surface of the printed circuit board 20. As a routing direction, "X" represents the leftward and rightward directions on the sheet of paper, while "Y" designates the upward and downward directions on the sheet of paper. As a sub-routing direction, "X (the upward and downward directions on the sheet of paper)" is represented within the routing controlled area 75, "Y (the upward and downward directions on the sheet of paper)" is represented within the routing controlled area 76, and "X" (the leftward and rightward directions on the sheet of paper) is represented within the routing controlled area 77.

With the above settings, only routings advancing in the downward directions on the sheet of paper from wiring pins 78 through 82 are performed on the front surface of the printed circuit board according to the routing control conditions designated as above.

After that, the routing are performed in the leftward direction on the sheet of paper without providing a VIA, avoiding a routing in the sub-routing direction as much as possible within the routing controlled area 76. If a routing in the leftward direction on the sheet of paper is impossible due to obstacles such as a pad, another wire, etc. within the routing controlled area 76, the routing is performed in the upward direction on the sheet of paper as much as possible so as to circle the obstacle since a cost in the upward direction at the bifurcating point of the route is set at a low value.

Within the routing controlled area 77, the routings are performed in the downward direction on the back surface of the printed circuit board 20 via VIAs 83 through 87, respectively, according to the routing control conditions designated in the routing controlled area 77.

As this, the automatic routing unit 19 automatically carries out an L-shaped routing as shown in FIG. 14.

(2) Crank Routing

If a crank routing as shown in FIG. 15 is performed on the printed circuit board 20, the operator inputs area information to set routing controlled areas 91 through 93.

For example, the operator designates "routing layer: 1", "routing direction: X", "forbid a VIA", "permit a routing in the sub-routing direction", and "a high cost of the upward direction routing" as routing control conditions (area control A) to a routing controlled area 91 through the area internal routing manner input unit 17. The operator then designates "routing layer: 1", "routing direction: Y", "forbid a VIA", "permit a routing in the sub-routing direction", "a high cost of a routing in the rightward direction", "a high cost of a routing in the upward direction", and "a low cost of a routing in the downward direction" as routing control conditions (area control B) to the routing controlled area 92 through the area internal routing manner input unit 17.

Similarly, the operator designates "routing layer: 1", "routing direction: X", "forbid a VIA", and "a low cost of a routing in the downward direction" as routing control conditions (area control C) to the routing controlled area 93 through the area internal routing manner input unit 17.

The routing controlled areas 91 through 93 are partially overlapped each other and set at this time. The automatic routing unit 19 uses a function of the priority determining unit 191 to perform an automatic routing according to the routing control conditions designated to the routing controlled area 92 having been set later within an area 921 in which the routing controlled areas 91 and 92 overlap each other. On the other hand, the automatic routing unit 19 performs an automatic routing according to the routing control conditions designated to the routing controlled area 93 having been set later within an area 931 in which the routing controlled areas 92 and 93 overlap each other.

With the above settings, the routing are carried out only in the rightward direction on the sheet of paper on the front surface of the printed circuit board 20 from wiring pins 94 and 95 under the routing control conditions designated as above within the routing controlled area 91.

After that, the routings are performed in the downward direction on the sheet of paper on the front surface of the printed circuit board 20 under the routing control conditions designated to the routing controlled area 92 having a higher priority than the routing controlled area 91 within the area 921 in which the routing controlled areas 91 and 92 overlap until paths reach the area 931 in which the routing controlled areas 92 and 93 overlap. At this time, the routings are so performed as to be set aside on the left side on the sheet of paper in the routing controlled area 92 since "a high cost of a routing in the rightward direction" is designated as one of the routing control conditions to the routing controlled area 92.

Within the area 931 in which the routing areas 92 and 93 overlap, the routings are then performed in the rightward direction on the sheet of paper on the layer on the front surface of the printed circuit board 20 under the routing control conditions designated to the routing controlled area 93 having a higher priority than the routing controlled area 92 until the routing paths reach the wiring pins 96 and 97. At this time, the routing are so performed as to be set aside on the down side on the sheet of paper in the routing controlled area 93 since "a low cost of a routing in the downward direction" is designated as one of the routing control conditions to the routing controlled area 93.

As above, the automatic routing unit 19 automatically routes crank paths as shown in FIG. 15.

According to the automatic routing apparatus 10 of this embodiment, a routing controlled area in which a routing is automatically performed under various routing control conditions is set within a routing area that is an object of a wiring design of a printed circuit board or the like, and a routing is automatically performed under the designated various specific routing control conditions within the routing controlled area, as described above. It is thus possible to set and designate in detail a control of an automatic routing within a wiring area that is an object of the routing design, thereby achieving an optimum automatic routing in a short period of time even under severe routing design conditions caused by a high-density mounting of the object of the wiring design.

According to the automatic routing apparatus 10 of this embodiment, a routing is automatically performed under routing control conditions designated to a routing controlled area having a high priority within an area in which plural routing controlled areas overlap. It is thus unnecessary to designate the routing control conditions in the area in which the routing controlled areas overlap using individual area information or condition information. This makes it possible to largely decrease a volume of data when the routing control conditions are designated, and largely speed up a process to make a file necessary to control the automatic routing by the automatic routing unit 19, etc. so that an optimum automatic routing may be performed at a high rate.

Priorities of the above plural routing controlled areas are determined by the priority determining unit 191 in the order set. In consequence, individual information used to determine priorities of the routing controlled areas is unnecessary. This makes it possible to determine the priorities of the routing controlled areas at a high rate so as to perform an optimum automatic routing.

Each of the automatic routings in the automatic routing apparatus 10 of this embodiment is performed on the basis of the maze method. It is noted that an automatic routing in the automatic routing apparatus of this invention is not limited to the maze method, but feasible on the basis of another routing method such as the line search method.

In the automatic routing apparatus 10 of this embodiment, an object of the routing design is a printed circuit board 20. It is noted that the automatic routing apparatus of this invention is not limited to the above example, but applicable to an LSI as an object of the routing design similarly to this embodiment.

What is claimed is:

1. An automatic routing method, comprising:
setting a cost parameter for at least one of a bifurcated route, a number of curves, a length of parallel wires, and a number of wires adjacent to an unrouted wiring pin; and, automatically determining a route of a wiring pattern within a route controlled area of a wiring design based on the cost parameter set by said setting step.

2. A method according to claim 1, further comprising setting cost-overriding information for a route controlled area prior to said determining step regarding at least one of routing through wiring layers, routing entirely within the route controlled area, permitting VIAs, routing in a sub-routing direction, routing in an upward, downward, rightward, and leftward direction, exceeding a wiring capacity, permitting a wire crossing, and altering a main-routing direction; and wherein said determining overrides the cost parameter based on the cost-overriding information.

3. A method according to claim 1, further comprising prioritizing each of a plurality of route controlled areas having an overlapping portion prior to said determining step;

wherein said setting step sets the cost for routing parameters for each of the plurality of route controlled areas; and wherein said determining determines the route of the wiring pattern in the overlapping portion based on the cost for routing parameters of one of the plurality of route controlled areas having a highest priority.

4. An automatic routing apparatus comprising:

a condition input unit setting a cost for routing parameters and cost-overriding information for a route controlled area of a wiring design regarding at least one of routing through wiring layers, routing entirely within the route controlled area, permitting VIAs, routing in a sub-routing direction, routing in an upward, downward, rightward, and leftward direction, exceeding a wiring capacity, permitting a wire crossing, and altering a main-routing direction; and an automatic routing unit automatically determining a route of a wiring pattern within the route controlled area based on the cost for routing parameters set by said condition input unit, wherein said automatic routing unit overrides the cost function based on the cost-overriding information.

5. An automatic routing apparatus comprising:

a condition input unit setting a cost for routing parameters for each of a plurality of route controlled areas;

a priority determining unit prioritizing each of the plurality of route controlled areas having an overlapping portion; and an automatic routing unit automatically determining a route of a wiring pattern in the overlapping portion based on the cost for routing parameters of one of the plurality of route controlled areas having a highest priority.

6. An automatic routing apparatus, comprising:

a condition input unit setting a cost parameter for at least one of a bifurcated route, a number of curves, a length of parallel wires, and a number of wires adjacent to an unrouted wiring pin; and, an automatic routing unit automatically determining a route of a wiring pattern within a route controlled area of a wiring design based on the cost parameter set by said condition input unit.

7. An apparatus according to claim 6, wherein said condition input unit sets cost-overriding information for a route controlled area regarding at least one of routing through wiring layers, routing entirely within the route controlled area, permitting VIAs, routing in a sub-routing direction, routing in an upward, downward, rightward, and leftward direction, exceeding a wiring capacity, permitting a wire crossing, and altering a main-routing direction; and wherein said automatic routing unit overrides the cost parameter based on the cost-overriding information.

8. An apparatus according to claim 6, further comprising a priority determining unit prioritizing each of a plurality of route controlled areas having an overlapping portion;

wherein said condition input unit sets the cost for routing parameters for each of the plurality of route controlled areas; and wherein said automatic routing unit determines the route of the wiring pattern in the overlapping portion based on the cost for routing parameters of one of the plurality of route controlled areas having a highest priority.

9. An automatic routing method comprising:

setting a cost for routing parameters and cost-overriding information for a route controlled area of a wiring design regarding at least one of routing through wiring layers, routing entirely within the route controlled area, permitting VIAs, routing in a sub-routing direction, routing in an upward, downward, rightward, and leftward direction, exceeding a wiring capacity, permitting a wire crossing, and altering a main-routing direction; and automatically determining a route of a wiring pattern within the route controlled area based on the cost for routing parameters set by said setting step, wherein said determining step overrides the cost function based on the cost-overriding information.

10. An automatic routing method, comprising:

setting a cost for routine parameters for each of a plurality of route controlled areas;

prioritizing each of the plurality of route controlled areas having an overlapping portion; and automatically determining a route of a wiring pattern within the overlapping portion based on the cost for routing parameters of one of the plurality of route controlled areas having a highest priority.

* * * * *